Figure 1:
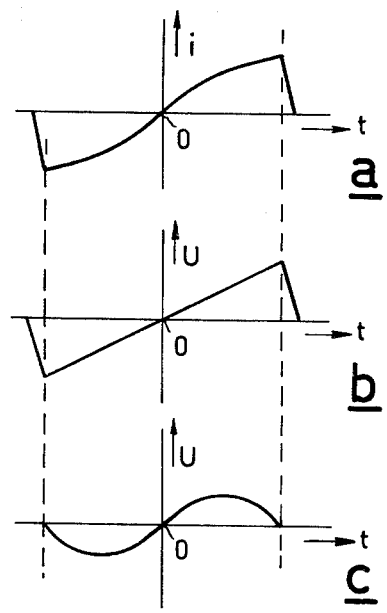

United States Patent
Wölber

[11] 3,935,507
[45] Jan. 27, 1976

[54] CORRECTION CIRCUIT IN TELEVISION DISPLAY APPARATUS USING DIFFERENTIAL AMPLIFIERS

[75] Inventor: Jörg Wölber, Hamburg, Germany

[73] Assignee: U.S. Philips Corporation, New York, N.Y.

[22] Filed: Feb. 26, 1974

[21] Appl. No.: 445,908

[30] Foreign Application Priority Data
Mar. 8, 1973 Germany.......................... 2311574

[52] U.S. Cl. .............. 315/370; 235/197; 315/368; 330/30 D; 330/69; 315/403
[51] Int. Cl.² ........................................ H01J 29/70
[58] Field of Search.......... 315/368, 370, 403, 13 C; 235/197; 330/69, 30 D

[56] References Cited
UNITED STATES PATENTS

| | | | |
|---|---|---|---|
| 3,465,137 | 9/1969 | Brouillette, Jr. et al. | 315/370 X |
| 3,512,039 | 5/1970 | Klensch | 315/370 X |
| 3,560,727 | 2/1971 | Schussler | 235/197 |

*Primary Examiner*—Richard A. Farley
*Assistant Examiner*—Richard E. Berger
*Attorney, Agent, or Firm*—Frank R. Trifari; Henry I. Steckler

[57] ABSTRACT

A circuit arrangement in television display apparatus for deforming a sawtooth signal, for example, for the S correction, including a plurality of difference amplifiers having a common input terminal and a common output terminal.

8 Claims, 6 Drawing Figures

CORRECTION CIRCUIT IN TELEVISION DISPLAY APPARATUS USING DIFFERENTIAL AMPLIFIERS

The invention relates to a circuit arrangement in television display apparatus for deforming a signal applied to an amplifier which applies a current to a coil for influencing the location of the landing spot of an electron beam on the screen of a television display tube, with means for applying a sawtooth input signal, the output signal undergoing an addition and/or subtraction.

A sawtooth generator whose output voltage is a linear function of time is generally used for the vertical (field frequency) deflection in television display apparatus. The current flowing through the field deflection coil must, however, be subjected to a so-called S correction so that an improvement of the picture geometry is obtained. Since the field output amplifier supplying this deflection current is generally a linear amplifier converting the input voltage originating from the sawtooth generator into a sawtooth output current, a deformation must be provided.

A known method for this purpose is the use on the one hand of such a (current) feedback that the output current of the amplifier varies less quickly at the commencement of the trace time than at the end, and on the other hand the integration of the output voltage of the sawtooth generator in such a manner that the input voltage of the amplifier varies less quickly at the commencement than at the end of the trace time. The first step determines the linearity of the upper part of the picture displayed while the second step determines the linearity of the lower part. Networks having time constants are required for this purpose. Due to the low repetition frequency, i.e. 50 or 60 Hz, of the field deflection, capacitors having a very high capacitance must be used, which capacitance has a large spread and is temperature dependent. Adjustment of the linearity is therefore inaccurate and may vary so that errors are produced or remain uncorrected. In addition this adjustment and that of the vertical amplitude (the picture height) are not independent of each other while the waveform obtained is not always symmetrical. Other known methods have the same drawback, that is to say, they also require capacitors having a very high capacitance.

An object of the invention is to provide a circuit arrangement which does not have the said drawback and which to this end uses so-called function generators which are known in other branches of the technique. Such a generator is described in U.S. Pat. No. 3,560,727. An output signal is generated which is a given mathematical function of the input signal from the generator while the variation as a function of time consists of a number of line sections. Both the transitions of the line sections and the slope of each section are adjustable. The generator includes a number of amplifiers and inverter stages as well as many adjusting elements (potentiometers).

Since the output voltage of the sawtooth generator for the field deflection has a given shape, these potentiometers are not necessary in the circuit arrangement according to the invention, that is to say, adjusting resistors are determined once. This has the advantage that the circuit arrangement can be integrated in a semiconductor body which occupies a much smaller place than the above-mentioned capacitors and which is cheaper while its properties vary to a much lesser extent.

A drawback of the said function generator is that the adjustments of the line sections are not independent of each other because the slope of each line section is influenced by the preceding line sections. When a given line section must have a smaller slope than the preceding one, an inverter stage must be used. This requires a large number of adjusting elements and a time-consuming adjusting procedure.

The circuit arrangement according to the invention obviates this drawback and does not need inverter stages and to this end it is characterized in that the circuit arrangement includes a plurality of difference amplifiers each having a first and a second input input terminal, all first input terminals being connected together and to the means for applying the input signal, the second input terminals being connected to different biases, the difference amplifiers having a common load connected to an output terminal.

Embodiments of the invention are shown in the drawing and will be described hereinafter in greater detail.

Figure 2:
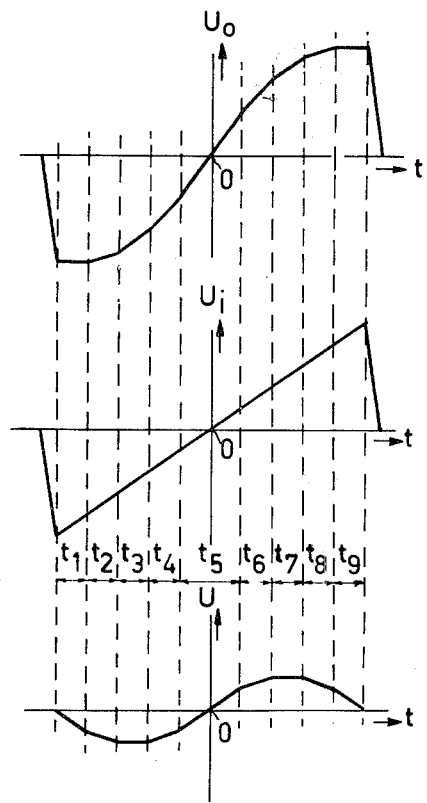
Figure 3:
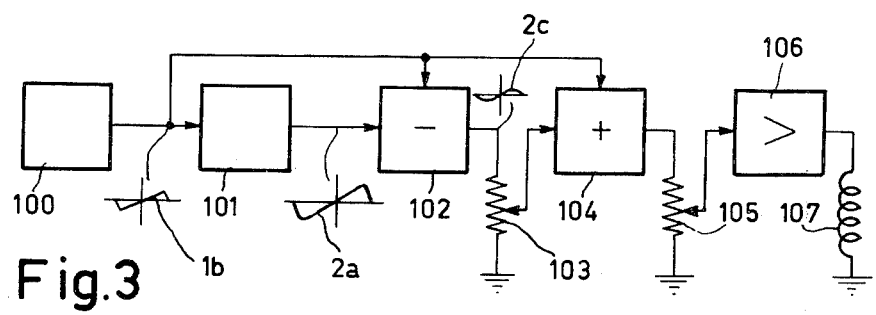
Figure 4:
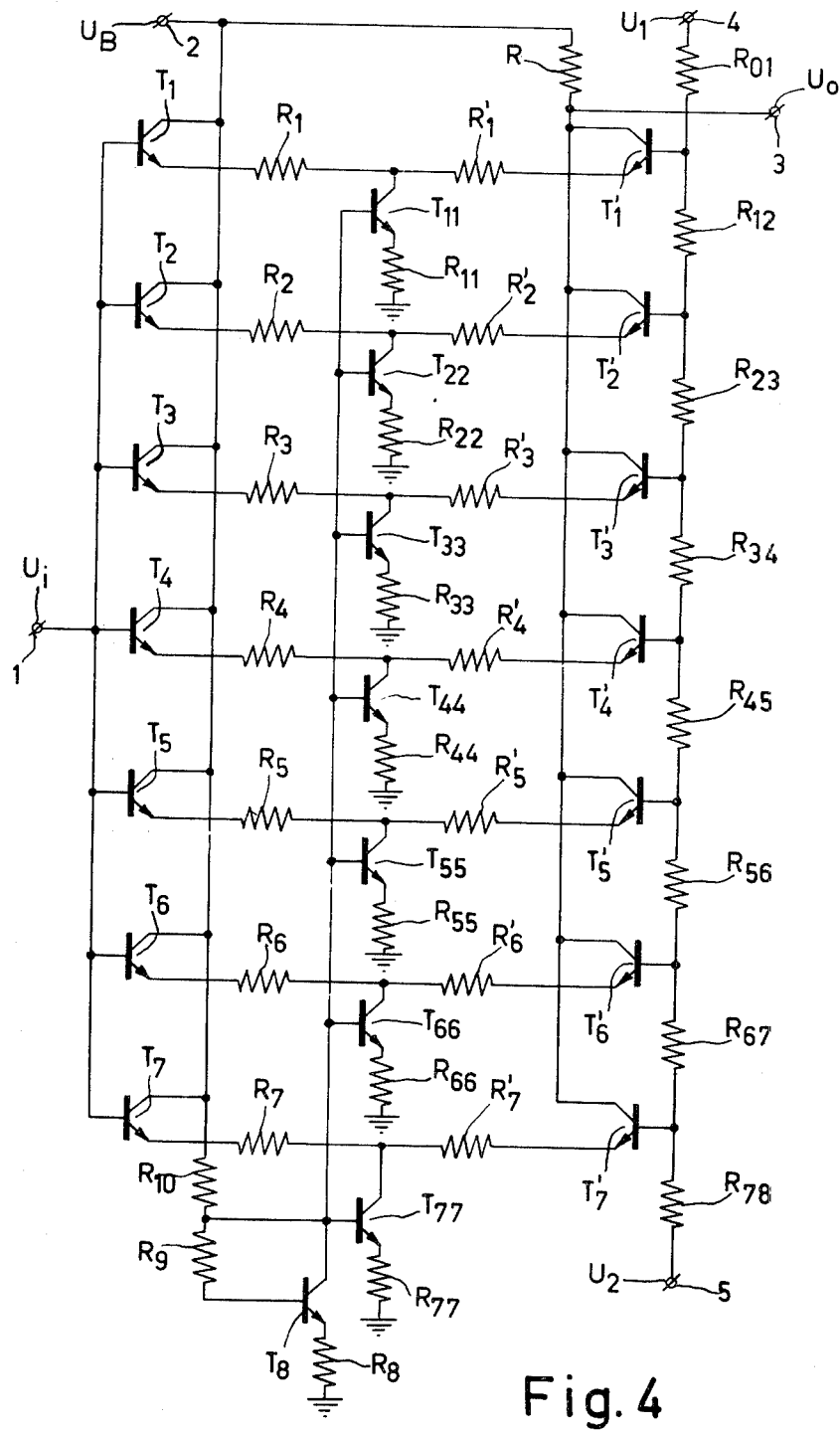
Figure 5:
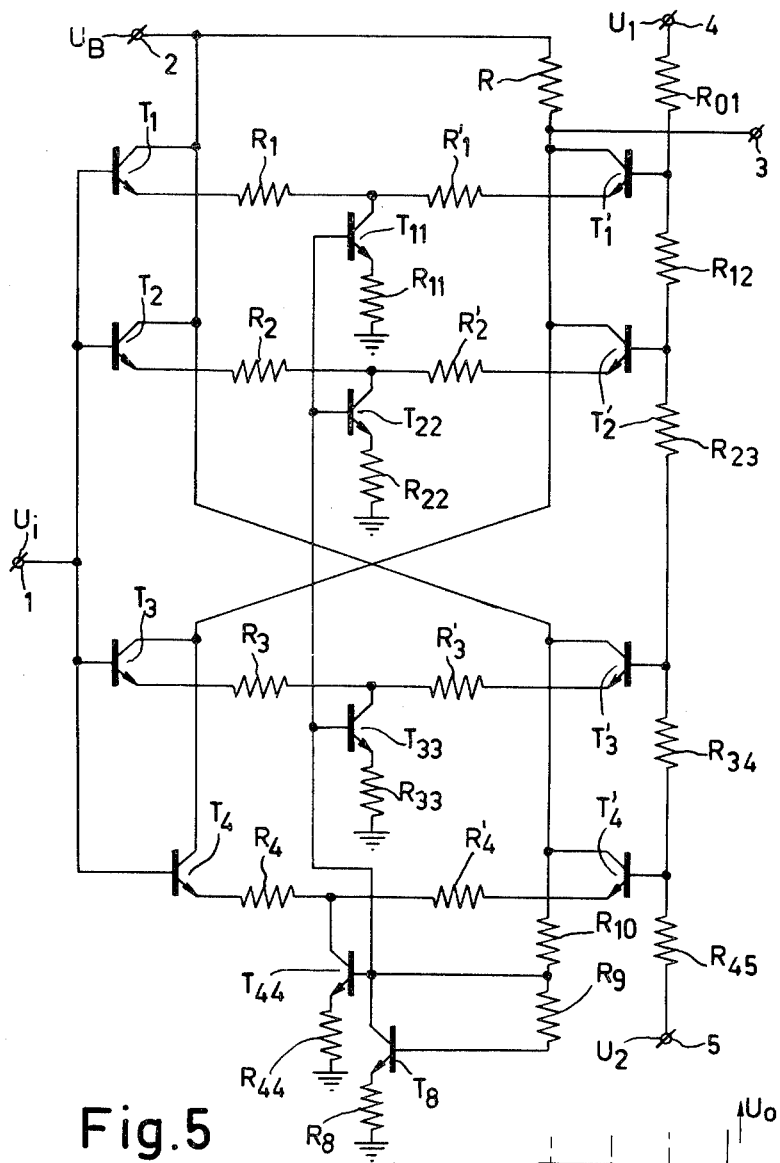

FIG. 1 and FIGS. 2a to c are graphic representations of currents or voltages as a function of time FIG. 3 is a block-schematic diagram including the circuit arrangement according to the invention FIG. 4 shows the difference amplifiers in a given embodiment FIG. 5 shows the difference amplifiers in a further embodiment, FIGS. 6a and b are graphic representations of currents or voltages as a function of time.

The curve in FIG. 1a shows that the required variation as a function of time of the deflection current in the vertical deflection coil of a television display apparatus is a so-called S-shaped variation over one period. According to the invention such a variation can be imitated by a circuit arrangement in which the degree of curvature of the two branches of the S-shaped curve is to be made adjustable according to FIG. 1a.

FIG. 1b shows the sawtooth voltage which is generally present at the output of the vertical oscillator and the output curve according to FIG. 1a is obtained from this curved by means of a sinusoidal curve according to FIG. 1c in a manner as described with reference to the FIGS. 2a to c and FIG. 3.

FIG. 3 shows a sawtooth oscillator 100. A voltage as shown in FIG. 2b is present at the output of this oscillator. This sawtooth voltage $U_i$ is available at the stage denoted by 101 which is referred to as a synthesis stage and which includes a difference amplifier circuit described hereinafter. Dependent on the number of difference amplifiers the stage 101 splits up and deforms the sawtooth voltage in different increments. For example, nine difference increments are shown in FIG. 2a in which the two increments to the right and left of the zero crossing are equal and show only a reverse polarity.

The signal according to FIG. 2a, for example, a voltage $U_o$, appears at the output of stage 101 and is combined with the sawtooth signal in a stage 102 in such a manner that the characteristic curve according to FIG. 2b is subtracted from the characteristic curve according to FIG. 2a. A substantially sinusoidal signal, for example a voltage, as shown in FIG. 2c is obtained at the output of the subtractor stage 102. It is then possible to adjust the amplitude of this signal by means of an amplitude adjusting element which is denoted by 103 in FIG. 3 and hence also the degree of S correction of the ultimate deflection current to be obtained. In a second stage 104 (see FIG. 3) this adjusted signal is added to the input signal according to FIG. 2b and a signal appears at the output of the stage 104 which has the same curve variation as in FIG. 1a. This signal thus has the desired S curvature which curvature may be more or less large by means of the element 103. This curvature is symmetrical to the zero point and this signal can then be applied by means of a further amplitude adjusting element as denoted by 105 in FIG. 3 to a subsequent output amplifier 106 applying the deflection current to the deflection coil 107. As is known coil 107 behaves substantially as a resistance so that the deflection current has the same shape as the input voltage of amplifier 106. Its variation is therefore substantially the same as the desired variation of FIG. 1a. Its amplitude and hence the picture height can be adjusted by means of element 105 while the linearity can be adjusted by means of element 103. Both adjustments thus do not influence each other. Since the signal of FIG. 2c is zero at the commencement and at the end of the trace time it does not contribute to the deflection.

FIG. 4 shows the synthesis stage 101 including the difference amplifier circuit by which the signal of FIG. 2a is composed. A first difference amplifier is constituted by two transistors $T_1$ and $T_1'$ whose emitters are connected together through two resistors $R_1$ and $R_1'$ having the same value, and by a third transistor $T_{11}$ whose collector is connected to the junction of the said resistors and whose emitter is connected through a resistor $R_{11}$ to ground of the circuit arrangement. Similarly three transistors $T_2$, $T_2'$ and $T_{22}$ and three emitter resistors $R_2$, $R_2'$, $R_{22}$ constitute a second difference amplifier. FIG. 4 shows seven of these amplifiers while the bases of the transistors $T_1$, $T_2$, ... $T_7$ are connected together and to an input terminal 1. The collectors of the same transistors are connected together and to a terminal 2 while the collectors of transistors $T_1'$, $T_2'$ ... $T_7'$ are connected together and to an output terminal 3.

The input signal $U_i$ of the stage 101 is applied to terminal 1, thus in this case the sawtooth voltage according to FIG. 2b while the output voltage $U_o$ according to FIG. 2a can be derived from the terminal 3. The terminal 2 is connected to a terminal of a voltage supply source $U_B$ the other terminal of which is connected to ground. A common output resistor R is arranged between the terminal 2 and the collectors of the transistors $T_1'$, $T_2'$, ... $T_7'$.

The bases of transistors $T_{11}$, $T_{22}$ ... $T_{77}$ are likewise connected together and to the collector of a transistor $T_8$. A resistor $R_8$ is connected between its emitter and ground and a resistor $R_9$ is connected between its collector and its base and a resistor $R_{10}$ is connected between the collector and terminal 2. Together with resistor $R_{10}$ and resistors $R_{11}$, $R_{22}$, ... $R_{77}$ transistors $T_{11}$, $T_{22}$, ... $T_{77}$ constitute current sources in which the current taken up by transistor $T_{66}$ is approximately.

$$I_{66} = \frac{U_B - V_{BE}}{R_{10}} \cdot \frac{R_8}{R_{66}},$$

in which $V_{BE}$ is the base emitter voltage of transistor $T_{66}$ which voltage is determined by the adjustment of transistor $T_8$ and in which the voltage drop across resistor $R_9$ has been left out of consideration.

The currents of the transistors $T_{11}$, $T_{22}$ ... $T_{77}$ may thus be adjusted independently of each other by suitable choice of the relevant emitter resistor $R_{11}$, $R_{22}$, ... $R_{77}$.

Eight resistors $R_{01}$, $R_{12}$, $R_{23}$, ... $R_{78}$ are arranged in series between a terminal 4 at which a direct voltage $U_1$ is present and a terminal 5 at which a direct voltage $U_2$ is present. The junction of resistors $R_{01}$ and $R_{12}$ is connected to the base of transistor $T_1'$ and that of resistors $R_{12}$ and $R_{23}$ is connected to the base of the transistor $T_2'$, etc. For example, the curve section in the time $t_3$ in FIG. 2a is formed by the difference amplifier pair $T_6$ and $T_6'$: the potential divider $R_{01}$, $R_{12}$, ... $R_{78}$ is proportioned in such a manner that the voltage at the base of the transistor $T_6'$ is equal to the value of the input voltage according to FIG. 2b in the middle of the third section. Furthermore the current $I_{66}$ is dimensioned in the manner described above such that the voltage drop $I_{66}.R$ is equal to the voltage variation shown in the time $t_3$ in FIG. 2a.

In order that the individual curve sections of FIG. 2a blend without any interruption, it is additionally to be ensured that in the given example $2I_{66}.R_6$ is equal to the voltage variation of the input voltage according to FIG. 2b in the time $t_3$. As a result it is achieved that the transistor $T_6'$ conveys the total current taken up by $T_{66}$ as long as the voltage $U_i$ is smaller than in FIG. 2b at the initiation of time $t_3$ and that on the other hand the transistor $T_6$ conveys the total current after $U_i$ has become larger than at the end of the time $t_3$ in FIG. 2b. When $U_i$ is between these limits a split-up of $I_6$ and $I_6'$ is the result while the sum is constantly equal to the given value of $I_{66}$.

When all other difference amplifiers are dimensioned in such a manner that their take-over ranges do not overlap, only one difference amplifier pair with the associated current source is active in each section and thus the variation of the curve according to FIG. 2a in a section always depends also on one difference amplifier with its current source. In FIG. 2a the slope of the curve sections in the times $t_1$ and $t_9$ was chosen to be zero so that no difference amplifier is required in these cases. Thus seven difference amplifiers for nine curve sections are sufficient. It may be evident that this step is not required and that the number of curve sections and hence the number of difference amplifiers can be chosen arbitrarily.

Figure 6:
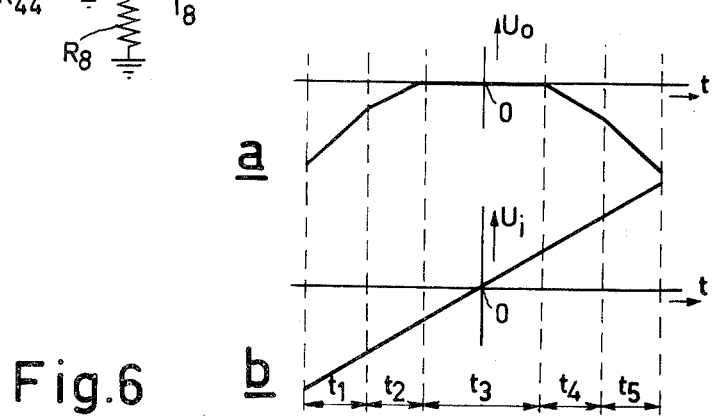

It is, however, only possible to synthesize curves with an arrangement according to FIG. 4 in which the sign of the derivative does not change as long as the sign of $U_i$ does not change. When, however, a circuit arrangement according to FIG. 5 is used, which is likewise dimensioned as the circuit arrangement according to FIG. 4, a change of the sign of the derivative of the output voltage $U_o$ (FIG. 6) is possible even when the derivative of the input voltage $U_i$ does not invert. FIG. 6 shows the synthesis of a parabolic signal in which, for example, five curve sections have been chosen. The collectors of the transistors $T_1$, $T_2$, $T_3'$ and $T_4'$ are connected together while the collectors of transistors $T_1'$, $T_2'$, $T_3$ and $T_4$ are connected together. As the slope of the output voltage in FIG. 6a is zero in the time $t_3$, four difference amplifiers are sufficient. Such a parabolic signal may be used, for example, for the dynamic convergence in a colour television display tube.

Since the described circuit arrangements only include resistors and transistors, they may advantageously be integrated in a semiconductor body. It will be noted that they do not include frequency-dependent elements so that possible variations of the frequency cannot have any influence and the scope of the invention need not be limited to a field frequency circuit arrangement. The above-mentioned circuit arrangement, for example, for the convergence may alternatively receive a line frequency signal.

What is claimed is:

1. A circuit arrangement in television display apparatus for deforming a signal applied to an amplifier which applies a current to a coil for influencing the location of the landing spot of an electron beam on the screen of a television display tube, with means for applying a sawtooth input signal, the output signal undergoing an addition and/or subtraction, characterized in that the circuit arrangement includes a plurality of difference amplifiers each having a first and a second input terminal, all first input terminals being connected together and to the means for applying the input signal, the second input terminals being connected to different biasses, the difference amplifiers having a common load connected to an output terminal.

2. A circuit arrangement as claimed in claim 1, characterized in that each difference amplifier comprises a first and a second transistor and a current source in which the base electrode of the first transistor constitutes the first input terminal while the base electrode of the second transistor constitutes the second input terminal, two resistors of equal value being incorporated between the emitter electrodes of the two transistors, the current source being connected to the junction of said resistors, the collector electrode of the first transistor being connected to a terminal of a voltage supply source, the collector electrode of the second transistor being connected to the output terminal.

3. A circuit arrangement as claimed in claim 1, characterized in that each difference amplifier comprises a first and a second transistor and a current source in which the base electrode of the first transistor constitutes the first input terminal while the base electrode of the second transistor constitutes the second input terminal, two resistors of equal value being included between the emitter electrodes of the two transistors, the current source being connected to the junction of said resistors, the collector electrode of the first transistor in a number of difference amplifiers being connected to a terminal of a voltage supply source and to the collector electrode of the first transistor in the other difference amplifiers, the collector electrode of the second transistor in the former difference amplifiers being connected to the output terminal and to the collector electrode of the first transistor in the other difference amplifiers.

4. A circuit arrangement as claimed in claim 2, characterized in that each difference amplifier comprises a first and a second transistor and a current source in which the base electrode of the first transistor constitutes the first input terminal while the base electrode of the second transistor constitutes the second input terminal, two resistors of equal value being included between the emitter electrodes of the two transistors, the current source being connected to the junction of said resistors, the collector electrode of the first transistor in a number of difference amplifiers being connected to a terminal of a voltage supply source and to the collector electrode of the first transistor in the other difference amplifiers, the collector electrode of the second transistor in the former difference amplifiers being connected to the output terminal and to the collector electrode of the first transistor in the other difference amplifiers, the series arrangement of a plurality of resistors is incorporated between two direct voltage sources and that each junction of two resistors constitutes a second input terminal.

5. A circuit arrangement as claimed in claim 1, characterized in that a signal for a field output amplifier is available at the output terminal of the circuit arrangement.

6. A circuit arrangement as claimed in claim 1, characterized in that a signal for an amplifier for the dynamic convergence is available at the output terminal of the circuit arrangement.

7. A semiconductor body in which at least the difference amplifiers as claimed in claim 1 are integrated.

8. A circuit arrangement comprising means for receiving an input signal, a plurality of difference amplifiers each having a first and a second input terminal, all first input terminals being coupled together and to the means for receiving the input signal, the second input terminals comprising means for receiving respectively different biasses, an output terminal, the difference amplifiers having a common load connected to said output terminal.

* * * * *